United States Patent
Yeh et al.

(10) Patent No.: US 9,397,253 B2
(45) Date of Patent: Jul. 19, 2016

(54) LIGHT EMITTING DIODE AND MANUFACTURING METHOD THEREFOR

(71) Applicant: Xiamen Sanan Optoelectronics Technology Co., Ltd., Xiamen (CN)

(72) Inventors: Meng-Hsin Yeh, Xiamen (CN); Jyh-Chiarng Wu, Xiamen (CN); Shaohua Huang, Xiamen (CN); Chi-Lun Chou, Xiamen (CN)

( * ) Notice: Subject to any disclaimer, the term of this patent is extended or adjusted under 35 U.S.C. 154(b) by 0 days.

(21) Appl. No.: 14/369,930

(22) PCT Filed: Jan. 7, 2013

(86) PCT No.: PCT/CN2013/070141
§ 371 (c)(1),
(2) Date: Sep. 19, 2014

(87) PCT Pub. No.: WO2013/104289
PCT Pub. Date: Jul. 18, 2013

(65) Prior Publication Data
US 2015/0048379 A1  Feb. 19, 2015

(30) Foreign Application Priority Data

Jan. 9, 2012  (CN) .......................... 2012 1 0003576
Jan. 9, 2012  (CN) .......................... 2012 1 0003578

(51) Int. Cl.
*H01L 21/337* (2006.01)
*H01L 33/00* (2010.01)
(Continued)

(52) U.S. Cl.
CPC ........ *H01L 33/0025* (2013.01); *H01L 33/0075* (2013.01); *H01L 33/32* (2013.01);
(Continued)

(58) Field of Classification Search
CPC ................... H01L 21/02381; H01L 21/02505; H01L 21/0254; H01L 33/0073; H01L 29/66636
USPC .......................... 257/14, 21, 22, 82, 184, 190
See application file for complete search history.

(56) References Cited

U.S. PATENT DOCUMENTS

| 6,033,927 A | * | 3/2000 | Shibata | ............... H01L 33/0095 372/45.01 |
| 2006/0071218 A1 | * | 4/2006 | Takeda | ................... B82Y 10/00 257/79 |

FOREIGN PATENT DOCUMENTS

| CN | 1283875 A | 2/2001 |
| CN | 1747184 | 3/2006 |

(Continued)

OTHER PUBLICATIONS

International Search Report for PCT/CN2013/070141, Date of mailing: Apr. 18, 2013, entitled: "Light Emitting Diode and Manufacturing Method Therefor".

(Continued)

*Primary Examiner* — Quoc Hoang
(74) *Attorney, Agent, or Firm* — Syncoda LLC; Feng Ma; Junjie Feng

(57) ABSTRACT

Disclosed are a light emitting diode having an n-doped ohm contact buffer layer and a manufacturing method therefor. In the present invention, a highly n-doped ohm contact buffer layer with an electronic concentration up to $1\times10^{18}$ cm$^3$ is formed on the n side of a light emitting epitaxy layer; when a growth substrate is removed, the n-type ohm contact buffer layer on the surface is exposed, which is a no-nitride polarity-face n-type GaN base material with a lower energy gap; an n-type ohm contact electrode is prepared on the n-type ohm contact buffer layer and follows the Ti/Al ohm contact electrode, which can overcome the problem of the existing vertical gallium nitride-based vertical light emitting diode that the voltage of the thin film GaN base light emitting device is unreliable because the ohm contact electrode on the nitride-face GaN base semiconductor layer is easy to crack due to temperature.

20 Claims, 5 Drawing Sheets

(51) Int. Cl.
  *H01L 33/32* (2010.01)
  *H01L 33/40* (2010.01)
  *H01L 33/64* (2010.01)

(52) U.S. Cl.
  CPC ............ *H01L 33/325* (2013.01); *H01L 33/40* (2013.01); *H01L 33/64* (2013.01); *H01L 2933/0016* (2013.01); *H01L 2933/0075* (2013.01)

(56) References Cited

FOREIGN PATENT DOCUMENTS

| CN | 1799123 | | 7/2006 |
| CN | 1835189 | A | 9/2006 |
| CN | 1941442 | A | 4/2007 |
| CN | 101350385 | | 1/2009 |
| CN | 101859818 | A | 10/2010 |
| CN | 102157656 | | 7/2011 |
| CN | 102522468 | A | 6/2012 |
| CN | 102569556 | A | 7/2012 |
| JP | 8125223 | | 5/1996 |

OTHER PUBLICATIONS

Hyunsoo Kim et al., Applied Physics Letters 93, 192106, (2008).
Ho Won Jang et al., Applied Physics Letters 94, 182108, (2009).
English translation of the Notification Concerning Transmittal of International Preliminary Report on Patentability for International Application No. PCT/CN2013/070141 "Light Emitting Diode and Manufacturing Method Therefor"; date of issuance: Jul. 15, 2014.
English translation of the Written Opinion of the International Searching Authority for International Application No. PCT/CN2013/070141 "Light Emitting Diode and Manufacturing Method Therefor"; date of mailing: Apr. 18, 2013.

* cited by examiner

LIGHT EMITTING DIODE AND MANUFACTURING METHOD THEREFOR

This application is the U.S. National Stage of International Application No. PCT/CN2013/070141, filed Jan. 7, 2013, which designates the U.S., published in Chinese, and claims priority under 35 U.S.C. 119 or 365 (c) to Chinese Patent Application No. 201210003578.3, filed Jan. 9, 2012, and Chinese Patent Application No. 201210003576.4, filed Jan. 9, 2012. The disclosures of the above applications are hereby incorporated by reference in their entirety.

BACKGROUND

To improve light-emitting efficiency of the GaN-based LED, the substrate transfer technology has been developed in recent years. The transfer processes may include: depositing a GaN-based thin film over a sapphire substrate via MOCVD, bonding the GaN-based thin film to a semiconductor or metal base using wafer bonding technology or electroplating technique, and removing the sapphire substrate using laser lift-off method; or depositing a GaN-based thin film over a SiC or Si substrate, bonding the GaN-based thin film to a semiconductor or metal base using wafer bonding technology or electroplating technique, and removing the SiC or Si substrate using chemical etching method. In this way, the thin-film GaN chip can achieve a higher light-emitting efficiency either by adding a reflecting layer between the epitaxial thin film and the base or by easily obtaining a rough light-emitting surface using photochemical etching method over the N-polar surface GaN. At the same time, the GaN-based thin-film chip transferred to a heat dissipation base has relatively large advantages in large-current applications due to good thermal conductivity of the transferred base.

However, the surface of the exposed GaN-based thin film after removal of the growth substrate is generally an N-polar surface. The ohmic contact property of the N-polar surface is different from that of the Ga-polar surface. For example, the N-type GaN ohmic contact electrode with a Ga-polar surface, in general, adopts a Ti/Al ohmic contact electrode. If the N-type GaN contact electrode with an N-polar surface adopts a Ti/Al ohmic contact electrode, at the initial time, the Ti/Al demonstrates a better ohmic contact property with the N-type GaN than with the Ga-polar surface. However, when the temperature rises to about 150° C., the contact property will degrade to Schottky contact and show a rise of forward working voltage, which seriously restricts the light-emitting efficiency of the thin-film GaN chip. In accordance with some representative discussions about the cause: Hyunsoo Kim et al. (APPLIED PHYSICS LETTERS 93, 192106, 2008) believed that it is attributed to the N vacancy and surface Ga vacancy as well as the atomic reaction of C and O, which lead to reduction of surface N vacancy; Ho Won Jang et al. (APPLIED PHYSICS LETTERS 94, 182108, 2009) reported that it is the diffusion of intrinsic N atom to the surface that leads to the reduction of surface N vacancy. By now, neither of the two study groups has put forward effective method for fabricating an N-type GaN ohmic contact electrode over the N-polar surface. In the thin-film flip-chip (TFFC) LED introduced by Philips Lumileds Lighting Company, the N-type ohmic contact electrode is still fabricated over the Ga-polar surface N-type GaN, i.e., it can use the Ti/Al ohmic contact electrode. Therefore, one notable advantage of TFFC is that it can totally avoid the N-polar surface problems as aforementioned. However, it exerts a higher requirement for chip inversion technology since the P and N electrodes over the thin film are required to be bonded to the positive and negative electrode areas of the base respectively. In addition, to prevent the thin film from breaking during laser lift-off of the sapphire substrate, the thin film surface, at the instant of laser lift-off of the sapphire, should be ensured to bear uniform impact force. Therefore, a medium should be filled between the thin film and the inverted bonding base before the laser lift-off, which may influence yield of device since it is difficult to control the filling consistency.

SUMMARY

The present disclosure relates to an LED having a doping n-type ohmic contact buffer layer and fabrication method, to overcome the defects of the vertical-type GaN-based LED, i.e., the ohmic contact electrode over the N-polar surface n-type GaN-based semiconductor layer is vulnerable to temperature cracking, which may lead to unreliable voltage of the thin-film GaN-based light-emitting device.

In a first aspect, a fabrication method for an LED epitaxial structure is provided, including: providing a growth substrate; forming a doping n-type ohmic contact buffer layer over the growth substrate, and the electron concentration is $1\times10^{18}$ cm$^{-3}$ or higher; forming a light-emitting epitaxial layer over the n-type ohmic contact buffer layer using epitaxial growth, including at least an n-type semiconductor layer, an active layer, and a p-type semiconductor layer from bottom up.

In some embodiments, the n-type ohmic contact buffer layer can be $Al_cIn_dGa_{1-c-d}N$ ($0\le c<1$, $0\le d<1$, $c+d<1$) of 3.4 eV or lower energy gap and 10 Å-5,000 Å thickness formed using epitaxial growth. In some preferred embodiments, to achieve high electron concentration, a high doping of $1\times10^{20}$ cm$^{-3}$ or higher is realized by injecting ion using ion implantation. In a second aspect, an LED epitaxial structure is provided, including: a growth substrate; an n-type ohmic contact buffer layer over the growth substrate, and the electron concentration is $1\times10^{18}$ cm$^{-3}$ or higher; a light-emitting epitaxial layer over the n-type ohmic contact buffer layer, including at least an n-type semiconductor layer, an active layer, and a p-type semiconductor layer from bottom up.

In some embodiments, the n-type ohmic contact buffer layer can be Si-doped nitride of $1\times10^{18}$ cm$^{-3}$ or higher doping concentration. The layer can be $Al_cIn_dGa_{1-c-d}N$ ($0\le c<1$, $0\le d<1$, $c+d<1$) of 3.4 eV or lower energy gap and 10 Å-5,000 Å thickness. In some preferred embodiments, to achieve high electron concentration, a high doping of $1\times10^{20}$ cm$^{-3}$ or higher is realized by injecting ion using ion implantation.

Further, the LED epitaxial structure may also include a Si-doped n-type nitride gradient semiconductor layer between the n-type ohmic contact buffer layer and the light-emitting epitaxial layer.

In a third aspect, a fabrication method for an LED chip is provided, including: providing a growth substrate; forming an n-type ohmic contact buffer layer over the growth substrate, and the electron concentration is $1\times10^{18}$ cm$^{-3}$ or higher; forming a light-emitting epitaxial layer over the n-type ohmic contact buffer layer using epitaxial growth, including at least an n-type semiconductor layer, an active layer, and a p-type semiconductor layer from bottom up; providing a conductive base to bond the light-emitting epitaxial layer with the conductive base; lifting off the growth substrate and a portion of the n-type ohmic contact buffer layer surface is exposed; and forming a p-electrode over the conductive base and an n-electrode over the surface of the n-type ohmic contact buffer layer.

In some embodiments, the n-type ohmic contact buffer layer can be $Al_cIn_dGa_{1-c-d}N$ ($0\le c<1$, $0\le d<1$, $c+d<1$) of $1\times10^{18}$ cm$^{-3}$ or higher doping concentration, 3.4 eV or lower energy gap, and 10 Å-5,000 Å thickness formed using epitaxial growth. In some preferred embodiments, to achieve high electron concentration, a high doping of $1\times10^{20}$ cm$^{-3}$ or higher is realized by injecting ion using ion implantation.

In a fourth aspect, an LED chip is provided, including: a conductive base with a front and a reverse surface; a light-emitting epitaxial layer over the front surface of the conductive base, including an n-type semiconductor layer, an active layer, and a p-type semiconductor layer from top down; a doping n-type ohmic contact buffer layer of $1\times10^{18}$ cm$^{-3}$ or higher electron concentration over the n-type semiconductor layer; a second electrode over the n-type ohmic contact buffer layer; and a first electrode over the reserve surface of the conductive base. In some embodiments, the n-type ohmic contact buffer layer can be Si-doped nitride of about $1\times10^{18}$ cm$^{-3}$ or higher doping concentration. The layer can be $Al_cIn_dGa_{1-c-d}N$ (0≤c<1, 0≤d<1, c+d<1) of 3.4 eV or lower energy gap and 10 Å-5,000 Å thickness. In some preferred embodiments, to achieve high electron concentration, a high doping of $1\times10^{20}$ cm$^{-3}$ or higher is realized by injecting ion using ion implantation.

The surface of the $Al_cIn_dGa_{1-c-d}N$ layer contacted with the growth substrate appears to have non-N polarity due to doping of high-concentrated n-type ions. In the GaN-based LED, the light-emitting epitaxial layer is formed over the n-type ohmic contact buffer layer with a high electron concentration using epitaxial growth. When removing the growth substrate, the n-type ohmic contact buffer layer with surface exposed can be non-N-polar n-type GaN-based material with low energy gap. An n-type ohmic contact electrode is fabricated over the n-type ohmic contact buffer layer by adopting the Ti/Al ohmic contact electrode, thereby avoiding the ohmic contact of N-polar surface and guaranteeing a relatively low working voltage for the thin-film GaN light-emitting device.

Further, the n-type ohmic contact buffer layer is selected as an initial nucleating layer with loose lattice and weak interatomic bonding strength due to high Si doping and low temperature growth, which is beneficial for the laser lift-off process or the wet etching process, since it can significantly reduce the transient high temperature over the growth substrate and the LED thin film interface from the laser lift-off process and huge stress and impact force from mechanical separation without increasing the structural defects of the LED epitaxial layer, thereby greatly reducing negative effects over the internal quantum efficiency. In some embodiments, when the electron concentration of the n-type ohmic contact buffer layer reaches $1\times10^{20}$ cm$^{-3}$, the doping concentration is required to be at least $1\times10^{20}$ cm$^{-3}$, which is hardly achievable only through epitaxial growth. However, such concentration or higher concentration can be achieved by using ion implantation method.

Other features and advantages of this present disclosure will be described in detail in the following specification, and it is believed that such features and advantages will become apparent in the specification or through the embodiments. The purposes and other advantages of the present disclosure can be realized and obtained in the structures as described in the specifications, claims and drawings.

Figure 1:
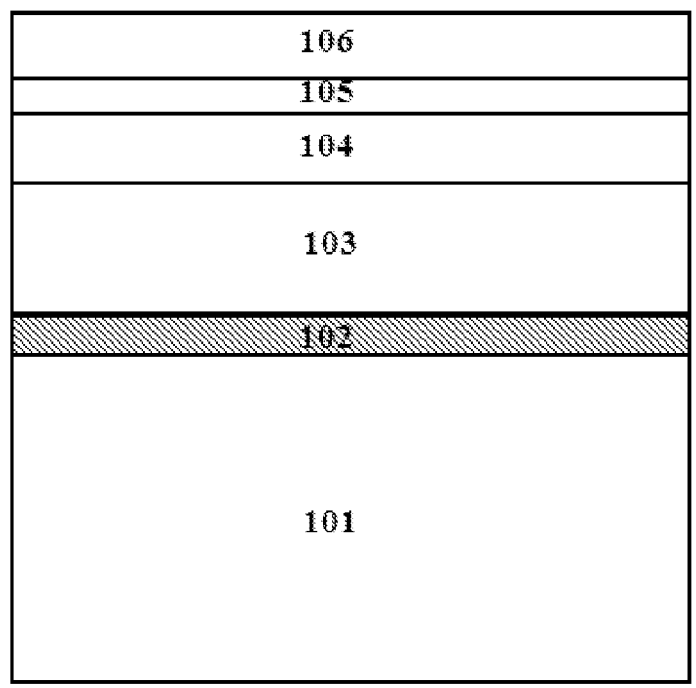
FIG. 1 is the schematic diagram of an LED epitaxial structure with the doping n-type ohmic contact buffer layer according to Embodiment 1.

In the drawings:
101. Epitaxial growth substrate; 102. n-type ohmic contact buffer layer; 103. n-type GaN layer; 104. Active layer; 105. Electron blocking layer; 106. p-type GaN layer; 107. Si-doped n-type nitride gradient semiconductor layer; 201. p-surface reflector and ohmic electrode layer; 202. p-surface metal diffusion blocking layer and bonding layer; 203. Conductive base; 204. Second electrode metal layer; 205. First electrode metal layer.

DETAILED DESCRIPTION

The present disclosure will be described in detail with reference to the accompanying figures and preferred embodiments. In specific device design and manufacture, the LED structures according to the present disclosure will be adjusted in terms of structure and dimension to some extent and changed with regards to the material selection based on specific application fields and process applications.

Embodiment 1

FIG. 1 is the schematic diagram of an LED epitaxial structure according to Embodiment 1. As shown in FIG. 1, an LED epitaxial structure is provided, including an epitaxial growth substrate 101, an n-type ohmic contact buffer layer 102 over the epitaxial growth substrate 101, an n-type GaN-based semiconductor layer 103 over the n-type ohmic contact buffer layer 102, an active layer 104 over the n-type GaN-based semiconductor layer 103, and a p-type GaN-based semiconductor layer 106 over the active layer 104, wherein, the material of the epitaxial growth substrate 101 includes but is not limited to sapphire, aluminum nitride, gallium nitride, silicon, and silicon carbide; the crystal orientation includes but is not limited to 0001 polar, semi-polar and non-polar direction; and the surface structure can be plane structure or patterned surface after special treatment.

The n-type ohmic contact buffer layer 102 can be $Al_cIn_dGa_{1-c-d}N$ layer (0≤c<1, 0≤d<1, c+d<1) with specific compositions, of 3.4 eV or lower energy gap, and 10 Å-5,000 Å film thickness. The n-type ohmic contact buffer layer 102 can be doped with silicon impurities of $1\times10^{18}$ cm$^{-3}$ or higher silicon concentration to enable an electron concentration of $1\times10^{18}$ cm$^{-3}$ or higher for the n-type ohmic contact buffer layer 102. The external surface can be non-N-polar surface. Within allowable scope, with the increase of the electron concentration of the n-type ohmic contact buffer layer 102, it is more beneficial for the fabrication of electrode structure over the external surface of the n-type ohmic contact buffer layer 102 in the later formation of vertical-structure LED chip.

The film of the n-type GaN-based semiconductor layer 103 can be 20,000 Å-40,000 Å thick; the active layer 104 can be a multi-quantum well structure, wherein the InGaN layer is selected as the well layer with an 18 Å-30 Å film thickness and the GaN layer is selected as the barrier layer with an 80 Å-200 Å film thickness; the film of the p-type GaN-based semiconductor layer 106 is 1,000 Å-3,000 Å thick; and a Mg-doped AlInGaN layer can be inserted between the p-type GaN-based semiconductor layer 106 and the active layer 104 as the electron blocking layer 105 of an 100 Å-600 Å film thickness.

Figure 2:
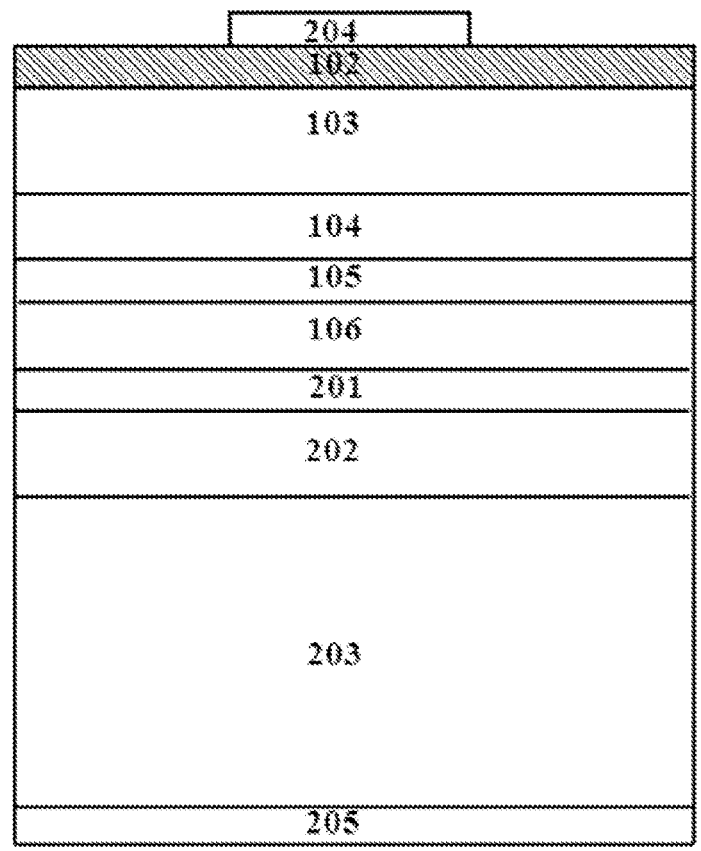
FIG. 2 is the cross section of the LED chip fabricated from the LED epitaxial structure according to FIG. 1.

FIG. 2 is the vertical-type LED chip fabricated from the LED epitaxial structure according to FIG. 1.

As shown in FIG. 2, an LED chip with a good n-type ohmic contact is provided, including a conductive base 203, a light-emitting epitaxial layer inversely welded over the front surface of the conductive base via the metal bonding layer 202, wherein, the light-emitting epitaxial layer is the structure of the LED epitaxial structure according to FIG. 1 after removal of the growth substrate, including a p-type GaN-based semiconductor layer, an electron blocking layer 105, an active layer 104, an n-type GaN-based semiconductor layer 103, and an n-type ohmic contact buffer layer 102 from top down; a second electrode metal layer 204 is formed over the n-type ohmic contact buffer layer 102; and a first electrode metal layer 205 is formed over the back of the conductive base 203. To improve the extraction efficiency, a p-surface reflector and ohmic electrode layer 201 can be inserted between the p-type GaN-based semiconductor layer and the conductive base and a p-surface metal diffusion blocking layer is added in the metal bonding layer 202. Since the second electrode metal layer 204 is fabricated over the highly doped n-type ohmic contact buffer layer 102, which avoids the problem that in the traditional vertical-type GaN-based LED chip, the contact property of the Ti/Al ohmic contact electrode fabricated over the N-polar surface of the n-type GaN-based semiconductor layer will degrade to Schottky contact if the temperature is 150° C. or higher. The LED epitaxial structure according to FIG. 1 and the LED chip according to FIG. 2 will be finished in accordance with the following processes.

Step 1: providing an epitaxial growth substrate 101, and forming a doping n-type ohmic contact buffer layer 102 of $1 \times 10^{18}$ cm$^{-3}$ or higher electron concentration and 3.4 eV or lower energy gap over the growth substrate using low-temperature epitaxial growth. The n-type ohmic contact buffer layer 102 can be Si-doped Al$_c$InGa$_{1-c-d}$N ($0 \le c < 1$, $0 \le d < 1$, $c+d < 1$) of $1 \times 10^{18}$ cm$^{-3}$ or higher Si doping concentration, and 10 Å-5,000 Å thickness. To achieve better n-type ohmic contact, the electron concentration may be increased to $1 \times 10^{20}$ cm$^{-3}$ or higher as appropriate. When the n-type ohmic contact buffer layer 102 is GaN, the growth temperature can be 500-600° C.

Step 2: forming an epitaxial structure over the n-type ohmic contact buffer layer 102 by epitaxial growth of a light-emitting epitaxial layer. The light-emitting epitaxial layer includes at least an n-type GaN-based semiconductor layer 103, an active layer 104, and a p-type semiconductor layer 106 from bottom up. The film of the n-type GaN-based semiconductor layer 103 can be 20,000 Å-40,000 Å thick; the active layer 104 can be a multi-quantum well structure, wherein the InGaN layer is selected as the well layer with an 18 Å-30 Å film thickness and the GaN layer is selected as the barrier layer with an 80 Å-200 Å film thickness; the film of the p-type GaN-based semiconductor layer 106 is 1,000 Å-3,000 Å thick; and to improve the internal efficiency of the light-emitting layer, a Mg-doped AlInGaN layer can be inserted between the p-type GaN-based semiconductor layer 106 and the active layer 104 as the electron blocking layer 105 of an 100 Å-600 Å film thickness.

Step 3: defining the chip dimension and finishing the mesa etching of the above epitaxial wafer using dry etching process, thereby finishing the chip-level separation of the epitaxial wafer. The etching depth should at least pass through the thin film of the epitaxial layer to the surface of the epitaxial growth substrate 101.

Step 4: providing a conductive base 203 to bond the light-emitting epitaxial layer with the conductive base 203. Forming a metal bonding layer 202 over the p-type GaN-based semiconductor layer 106 and the conductive base 203 respectively and bonding the light-emitting epitaxial layer with the conductive base 203 using the metal bonding process. To improve the extraction efficiency of the chip, a p-surface reflector and ohmic electrode layer 201 can be fabricated over the p-type GaN-based semiconductor layer 106 and a p-surface metal diffusion blocking layer is added in the metal bonding layer 202.

Step 5: lifting off the growth substrate 101. Removing the epitaxial growth substrate 101 by lifting-off, grinding or wet etching and separating the epitaxial growth substrate from the LED thin film, wherein the LED thin film is left over the reverse base and the surface of the n-type ohmic contact buffer layer 102 is exposed.

Step 6: forming a bottom electrode metal layer 205 over the conductive base and forming an n-surface electrode metal surface 204 over the surface of the n-type ohmic contact buffer layer, thereby finishing the fabrication of vertical structure LED.

In this embodiment, 2 samples are made based on the process according to this embodiment (the buffer layer is n-type doped) and according to traditional process (the buffer layer is not doped) respectively to assess the light-emitting output power, forward voltage and aging characteristics. The thickness layer of each semiconductor layer is set in accordance with Table 1.

TABLE 1

| Semiconductor layer | Various layers according to present disclosure Film thickness (Å) and structure | Various layers according to traditional process Film thickness (Å) and structure |
|---|---|---|
| Buffer layer 102 | n-type doping ohmic contact buffer layer 600 | Non-doped buffer layer 600 |
| n-type GaN-based semiconductor layer 103 | 25000 | 25000 |
| Active layer 104 | GaN(140)/InGaN(25) X10 period (last layer: GaN layer) | GaN(140)/InGaN(25) X10 period (last layer: GaN layer) |
| Electron blocking layer 105 | 600 | 600 |
| p-type GaN-based semiconductor layer 106 | 2000 | 2000 |

Figure 3:
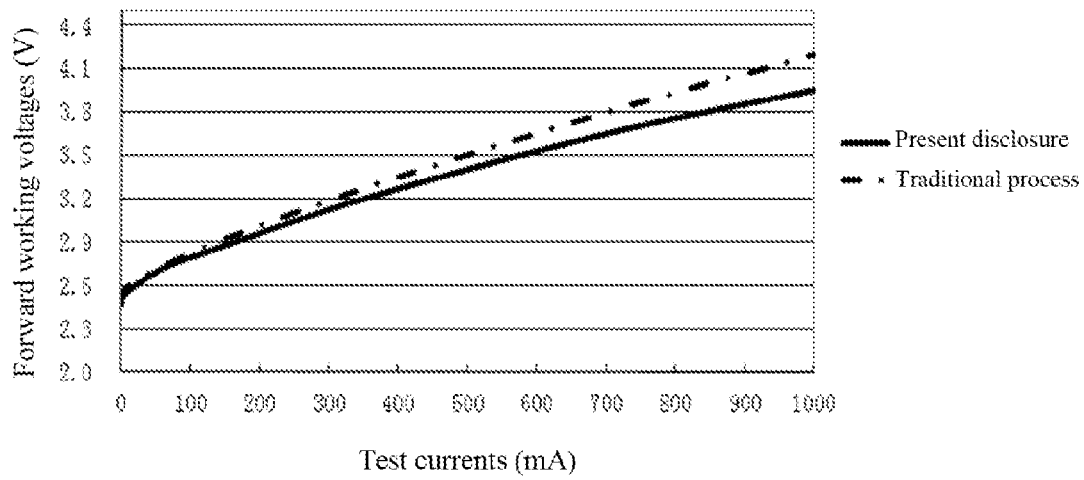
FIG. 3 is the graph of forward working voltages according to Embodiment 1.
Figure 4:
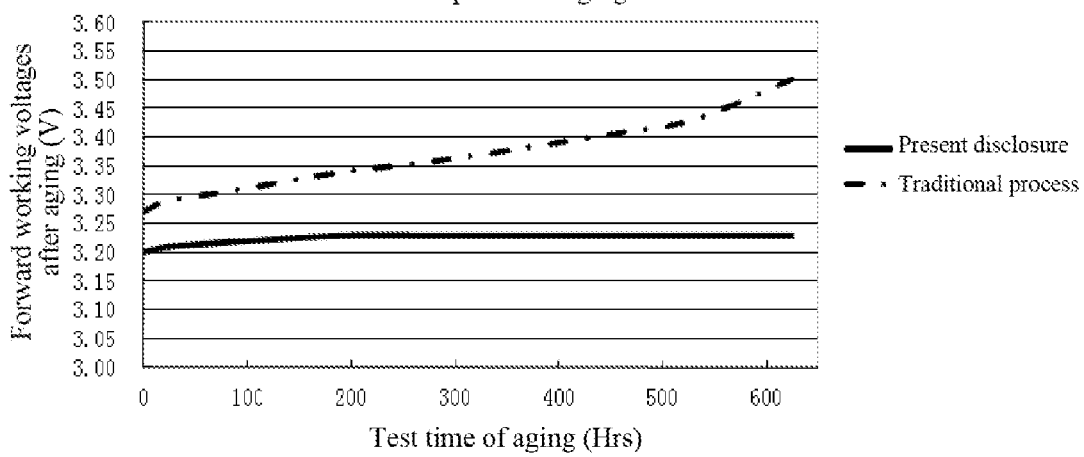
FIG. 4 is the graph of forward working voltages after aging according to Embodiment 1.
Figure 5:
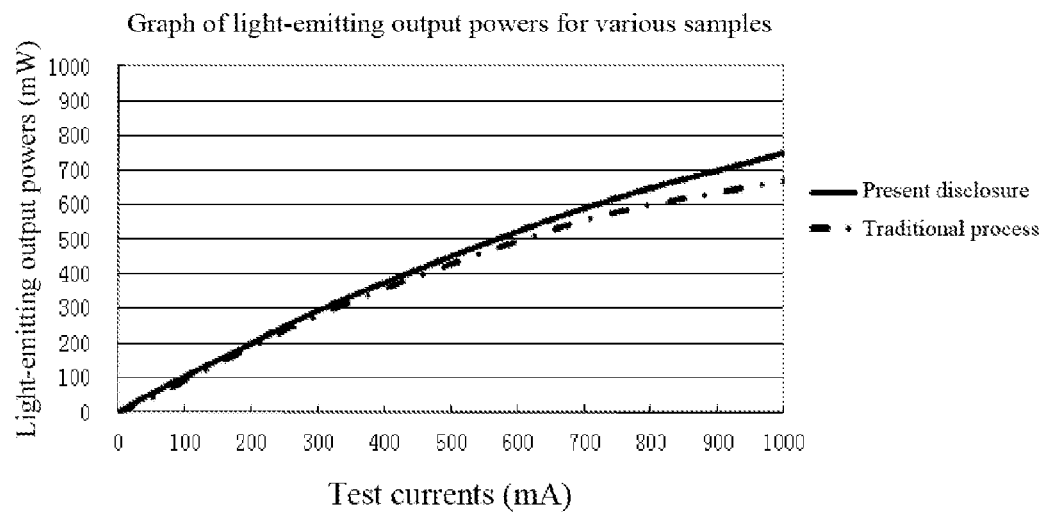
FIG. 5 is the graph of light-emitting output powers according to Embodiment 1.

FIGS. 3-5 show the assessment results.

FIG. 3 is the graph of forward working voltages for various samples according to this embodiment. As shown, the forward working voltages of the vertical-structure nitride LED samples according to this embodiment are lower than those of the vertical-structure nitride LED samples according to the traditional process.

FIG. 4 is the graph of forward working voltages for various samples after aging according to this embodiment. As shown, the forward working voltages after aging of the vertical-structure nitride LED samples according to this embodiment are much more reliable than those of the vertical-structure nitride LED samples according to the traditional process.

FIG. 5 is the graph of light-emitting output powers for various samples according to this embodiment. As shown, the light-emitting output powers of the vertical-structure nitride LED samples according to this embodiment are higher than those of the vertical-structure nitride LED samples according to the traditional process.

Embodiment 2

Figure 6:
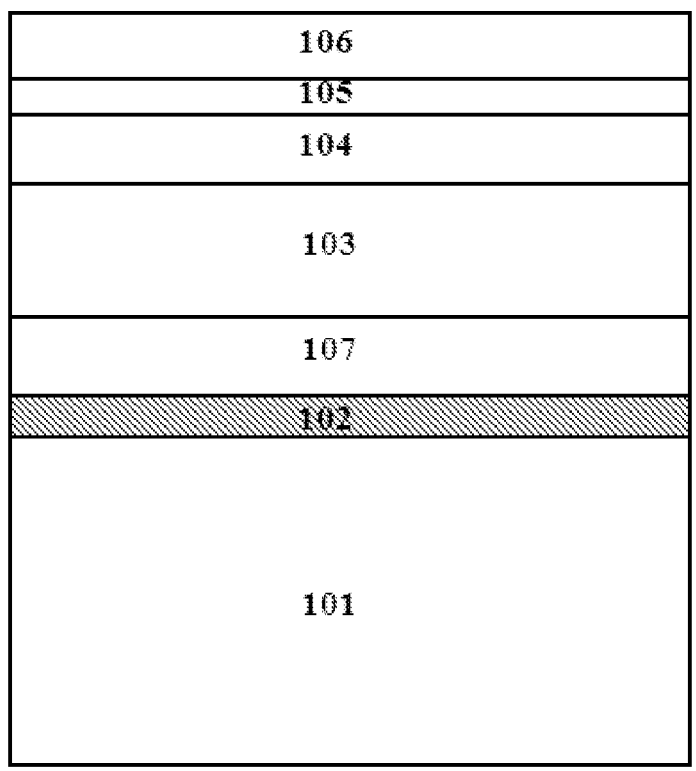
FIG. 6 is the schematic diagram of an LED epitaxial structure with the doping n-type ohmic contact buffer layer according to Embodiment 2.

FIG. 6 is the schematic diagram of an LED epitaxial structure according to Embodiment 2. Different from Embodiment 1, the n-type ohmic contact buffer layer 102 in this embodiment is doped with ions after growing the n-type ohmic contact buffer layer via ion implantation method to achieve a higher electron concentration. The total doping concentration can be as high as above $1 \times 10^{20}$ cm$^{-3}$. Other semiconductor material layers are grown by the second epitaxial growth method. To guarantee the quality of second epitaxial growth, first, grow a Si-doped n-type nitride gradient semiconductor layer over the n-type ohmic contact buffer layer 102. In the following, detailed descriptions will be given to the specific structures with reference to the drawings.

As shown in FIG. 6, an LED epitaxial structure is provided, including an epitaxial growth substrate 101, an n-type ohmic contact buffer layer 102 over the epitaxial growth substrate 101, a Si-doped n-type nitride gradient semiconductor layer 107 over the n-type ohmic contact buffer layer 102 via second epitaxial growth, an n-type GaN-based semiconductor layer 103 over the Si-doped n-type nitride gradient semiconductor layer 107; an active layer 104 over the n-type GaN-based semiconductor layer 103, and a p-type GaN-based semiconductor layer 106 over the active layer 104, The epitaxial growth substrate 101 can be obtained according to Embodiment 1, which will not be repeated here.

The n-type ohmic contact buffer layer 102 can be Al$_c$In$_d$Ga$_{1-c-d}$N layer (0≤c<1, 0≤d<1, c+d<1) with specific compositions, 3.4 eV or lower energy gap, and 10 Å-5,000 Å film thickness. The n-type ohmic contact buffer layer 102 can be doped with silicon impurities of $1 \times 10^{20}$ cm$^{-3}$ or higher silicon concentration using ion implantation method to enable an electron concentration of $1 \times 10^{20}$ cm$^{-3}$ or higher for the n-type ohmic contact buffer layer 102. The external surface appears to be non-N-polar.

The Si-doped n-type nitride gradient semiconductor layer 107 of an 100 Å-20,000 Å film thickness is formed via second epitaxial growth, wherein, the Si doping concentration is gradually changed from $1 \times 10^{17}$ cm$^{-3}$-$5 \times 10^{18}$ cm$^{-3}$ to $1 \times 10^{18}$ cm$^{-3}$-$5 \times 10^{19}$ cm$^{-3}$. In this embodiment, it is preferred that the Si-doped n-type nitride gradient semiconductor layer has a 4,000 Å-6,000 Å film thickness and Si doping concentration gradually changed from $1 \times 10^{17}$ cm$^{-3}$ to $1 \times 10^{19}$ cm$^{-3}$. An n-type ohmic contact buffer layer 102 having defected surface from ion implantation is repaired by the Si-doped n-type nitride gradient semiconductor layer to maintain the lattice quality of the GaN-based semiconductor layer after second epitaxial growth.

The film of the n-type GaN-based semiconductor layer 103 can be 20,000 Å-40,000 Å thick; the active layer 104 can be a multi-quantum well structure, wherein, the InGaN layer is selected as the well layer with an 18 Å-30 Å film thickness and the GaN layer is selected as the barrier layer with an 80 Å-200 Å film thickness; the film of the p-type GaN-based semiconductor layer 106 is 1,000 Å-3,000 Å thick; and a Mg-doped AlInGaN layer can be inserted between the p-type GaN-based semiconductor layer 107 and the active layer 104 as the electron blocking layer 105 of an 100 Å-600 Å film thickness.

Figure 7:
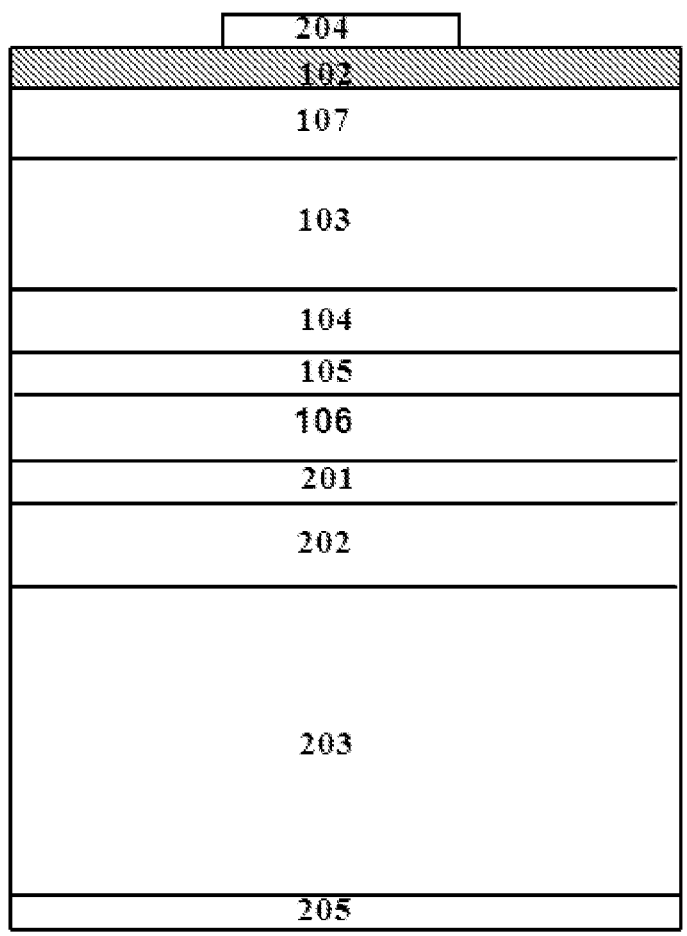
FIG. 7 is the cross section of the LED chip fabricated from the LED epitaxial structure according to FIG. 6.

FIG. 7 is the vertical-type LED chip fabricated from a LED epitaxial structure according to FIG. 6.

As shown in FIG. 7, an LED chip with an n-type ohmic contact is provided, including a conductive base 203, a light-emitting epitaxial layer inversely bonded over the front surface of the conductive base via the metal bonding layer 202, wherein, the light-emitting epitaxial layer is the structure of the LED epitaxial structure according to FIG. 6 after removal of the growth substrate, including a p-type GaN-based semiconductor layer 106, an electron blocking layer 105, an active layer 104, an n-type GaN-based semiconductor layer 103, a Si-doped n-type nitride gradient semiconductor layer 107, and an n-type ohmic contact buffer layer 102 from top down; an n-surface electrode metal layer 204 over the n-type ohmic contact buffer layer 102; and a bottom electrode metal layer 205 over the back of the conductive base 203. To improve the extraction efficiency, a p-surface reflector and ohmic electrode layer 201 can be inserted between the p-type GaN-based semiconductor layer and the conductive base and a p-surface metal diffusion blocking layer is added in the metal bonding layer 202. Since the n-surface electrode metal layer 204 is bonded with the n-type GaN-based semiconductor layer 104 via the doping n-type ohmic contact buffer layer 102, which avoids the problem that in the traditional vertical-type GaN-based LED chip, the contact property of the Ti/Al ohmic contact electrode fabricated over the N-polar surface of the n-type GaN-based semiconductor layer will degrade to Schottky contact if the temperature is 150° C. or higher.

The LED epitaxial structure according to FIG. 6 and the LED chip according to FIG. 7 can be finished in accordance with the following processes.

Step 1: providing an epitaxial growth substrate 101, and forming a doping n-type ohmic contact buffer layer 102 of $1 \times 10^{20}$ cm$^{-3}$ or higher electron concentration and 3.4 eV or lower energy gap over the growth substrate using low-temperature epitaxial growth. The n-type ohmic contact buffer layer 102 can be Si-doped Al$_c$IndGa$_{1-c-d}$N (0≤c<1, 0≤d<1, c+d<1) of $1 \times 10^{20}$ cm$^{-3}$ or higher Si doping concentration, and 10 Å-5,000 Å thickness by injecting Si ion through the ion implantation method. When the n-type ohmic contact buffer layer 102 is GaN, the growth temperature can be 500-600° C.

Step 2: forming a Si-doped n-type nitride gradient semiconductor layer 107 of 100 Å-20,000 Å film thickness over the n-type ohmic contact buffer layer 102 via second epitaxial growth, wherein, the Si doping concentration is gradually changed from $1 \times 10^{17}$ cm$^{-3}$-$5 \times 10^{18}$ cm$^{-3}$ to $1 \times 10^{18}$ cm$^{-3}$-$5 \times 10^{19}$ cm$^{-3}$. In this embodiment, it is preferred that the Si-doped n-type nitride gradient semiconductor layer has a 4,000 Å-6,000 Å film thickness and Si doping concentration gradually changed from $1 \times 10^{17}$ cm$^{-3}$ to $1 \times 10^{19}$ cm$^{-3}$. An n-type ohmic contact buffer layer 102 having defected surface from ion implantation is repaired by the Si-doped n-type nitride gradient semiconductor layer to maintain the lattice quality of the GaN-based semiconductor layer after second epitaxial growth.

Step 3: forming an epitaxial structure over the n-type ohmic contact buffer layer 107 by epitaxial growth of a light-emitting epitaxial layer. The light-emitting epitaxial layer includes at least an n-type GaN-based semiconductor layer 103, an active layer 104, and a p-type semiconductor layer 106 from bottom up. The film of the n-type GaN-based semiconductor layer 103 can be 20,000 Å-40,000 Å thick; the active layer 104 can be a multi-quantum well structure, wherein, the InGaN layer is selected as the well layer with an 18 Å-30 Å film thickness and the GaN layer is selected as the barrier layer with an 80 Å-200 Å film thickness; the film of the p-type GaN-based semiconductor layer 106 is 1,000 Å-3,000 Å thick; and a Mg-doped AlInGaN layer can be inserted between the p-type GaN-based semiconductor layer 106 and the active layer 104 as the electron blocking layer 105 of 100 Å-600 Å film thickness.

Step 4: defining the chip dimension and finishing the mesa etching of the above epitaxial wafer using dry etching process, thereby finishing the chip-level separation of the epitaxial wafer. The etching depth should at least pass through the thin film of the epitaxial layer to the surface of the epitaxial growth substrate 101.

Step 5: providing a conductive base 203 to bond the light-emitting epitaxial layer with the conductive base 203. Forming a metal bonding layer 202 over the p-type GaN-based semiconductor layer 107 and the conductive base 203 respectively and bonding the light-emitting epitaxial layer with the conductive base 203 using the metal bonding process. To improve the extraction efficiency of the chip, a p-surface reflector and ohmic electrode layer 201 can be fabricated over the p-type GaN-based semiconductor layer 106 and a p-surface metal diffusion blocking layer is added in the metal bonding layer 202.

Step 6: lifting off the growth substrate 101. Removing the epitaxial growth substrate 101 by lifting-off, grinding or wet etching and separating the epitaxial growth substrate from the LED thin film, wherein, the LED thin film is left over the reverse base and the surface of the n-type ohmic contact buffer layer 102 is exposed.

Step 7: forming a bottom electrode metal layer 205 over the conductive base and forming an n-surface electrode metal surface 204 over the surface of the n-type ohmic contact buffer layer, thereby finishing the fabrication of vertical structure LED.

In this embodiment, 2 samples are made based on the processes according to this embodiment (the buffer layer is highly-doped n-type by injecting Si ions) and according to traditional process (the buffer layer is not doped) respectively to assess the light-emitting output power, forward voltage and aging characteristics. The thickness layer of each semiconductor layer is set in accordance with Table 2.

TABLE 2

| Semiconductor layer | Various layers according to present disclosure Film thickness (Å) and structure | Various layers according to traditional process Film thickness (Å) and structure |
|---|---|---|
| Buffer layer 102 | n-type doping ohmic contact buffer layer 600 | Non-doped buffer layer 600 |
| Si-doped N-type nitride gradient semiconductor layer 107 | 5000 | None |
| n-type GaN-based semiconductor layer 103 | 25000 | 25000 |
| Active layer 104 | GaN(140)/InGaN(25) X10 period (last layer: GaN layer) | GaN(140)/InGaN(25) X10 period (last layer: GaN layer) |
| Electron blocking layer 105 | 600 | 600 |
| p-type GaN-based semiconductor layer 106 | 2000 | 2000 |

Figure 8:
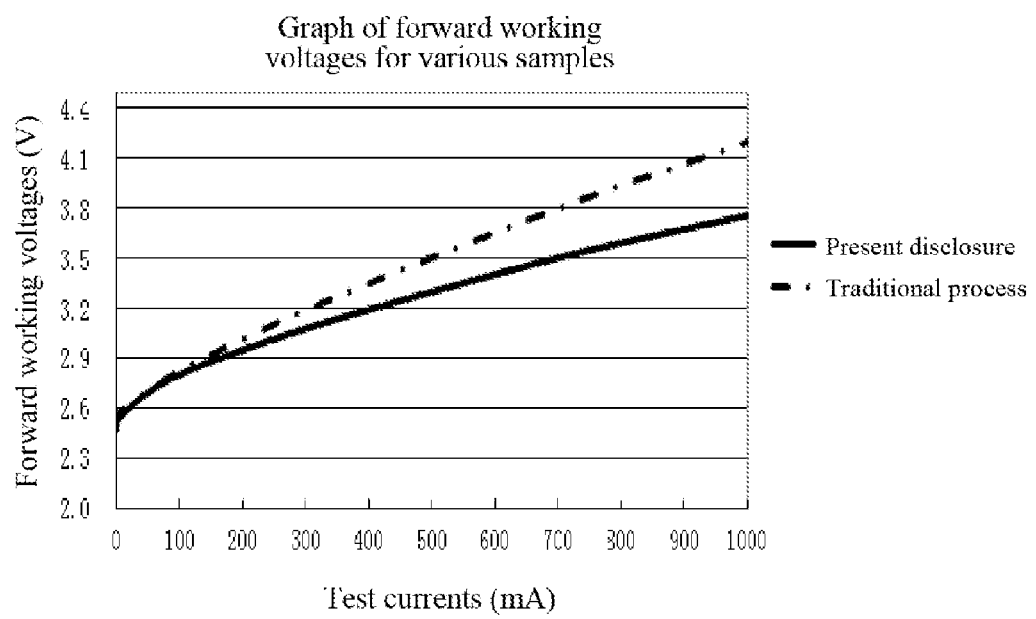
FIG. 8 is the graph of forward working voltages according to Embodiment 2.
Figure 9:
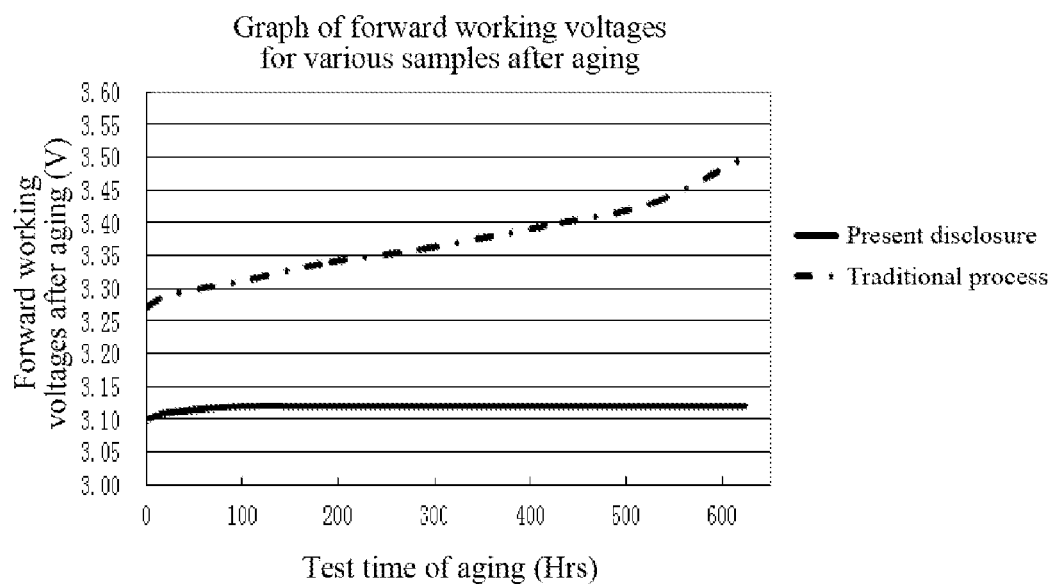
FIG. 9 is the graph of forward working voltages after aging according to Embodiment 2.
Figure 10:
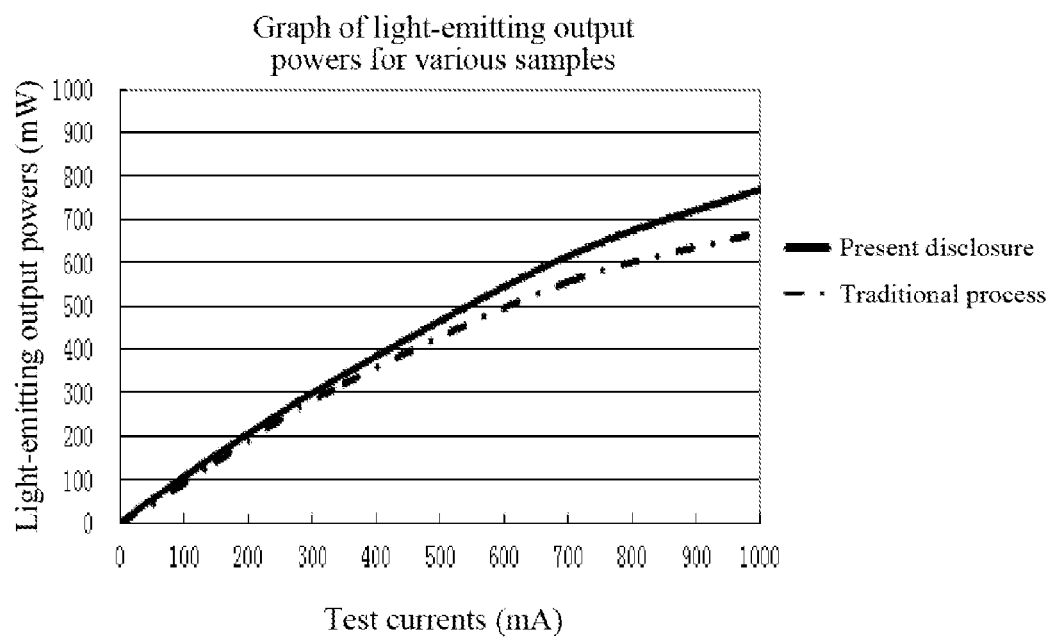
FIG. 10 is the graph of light-emitting output powers according to Embodiment 2.

FIGS. 8-10 show the assessment results.

FIG. 8 is the graph of forward working voltages for various samples according to this embodiment. As shown, the forward working voltages of the vertical-structure nitride LED samples according to this embodiment are lower than those of the vertical-structure nitride LED samples according to the traditional process.

FIG. 9 is the graph of forward working voltages for various samples after aging according to this embodiment. As shown, the forward working voltages after aging of the vertical-structure nitride LED samples according to this embodiment are much more reliable than those of the vertical-structure nitride LED samples according to the traditional process.

FIG. 10 is the graph of light-emitting output powers for various samples according to this embodiment. As shown, the light-emitting output powers of the vertical-structure nitride LED samples according to this embodiment are higher than those of the vertical-structure nitride LED samples according to the traditional process.

What is claimed is:

1. A fabrication method for a GaN-based LED epitaxial structure, including:
   providing a growth substrate;
   forming a GaN-based n-type ohmic contact buffer layer of 3.4 eV or lower bandgap and $1 \times 10^{18}$ cm$^{-3}$ or higher electron concentration over the growth substrate; and
   forming a light-emitting epitaxial layer via epitaxial growth over the n-type ohmic contact buffer layer including an n-type semiconductor layer over the n-type ohmic contact buffer layer, an active layer over the n-type semiconductor layer, and a p-type semiconductor over the active layer;
   wherein the LED epitaxial structure comprises:
   the n-type ohmic contact buffer layer of $1 \times 10^{18}$ cm$^{-3}$ or higher electron concentration over the growth substrate, wherein the n-type ohmic contact buffer layer has a non-Nitride-polarity surface for forming an n-type ohmic contact electrode thereon;
   the light-emitting epitaxial layer over the n-type ohmic contact buffer layer, including at least the n-type semiconductor layer, the active layer, and the p-type semiconductor layer.

2. The fabrication method according to claim 1, wherein the n-type ohmic contact buffer layer comprises Al$_c$In$_d$Ga$_{1-c-d}$N (0≤c<1, 0≤d<1, c+d<1) formed using epitaxial growth.

3. The fabrication method according to claim 1, wherein the n-type ohmic contact buffer layer of $1 \times 10^{20}$ cm$^{-3}$ or higher doping concentration is formed by injecting ion via the ion implantation method.

4. The fabrication method according to claim 1, wherein the n-type ohmic contact buffer layer is grown at a temperature of 500-600° C. to thereby form the non-Nitride-polarity surface.

5. The fabrication method according to claim 1, wherein a thickness of the n-type ohmic contact buffer layer is 10 Å-5,000 Å.

6. The fabrication method of claim 1, further comprising:
   providing a heat dissipation base to bond the light-emitting epitaxial layer with the conductive base;
   lifting off the growth substrate and exposing the non-Nitride-polarity surface of the n-type ohmic contact buffer layer; and
   forming a first electrode over the conductive base and forming a second electrode over the non-Nitride-polarity surface of the n-type ohmic contact buffer layer.

7. The fabrication method according to claim 6, wherein the n-type ohmic contact buffer layer is $Al_cIn_dGa_{1-c-d}N$ (0≤c<1, 0≤d<1, c+d<1) formed using epitaxial growth.

8. The fabrication method according to claim 6, wherein the n-type ohmic contact buffer layer is grown at a temperature of 500-600° C. to thereby form the non-Nitride-polarity surface.

9. The fabrication method according to claim 6, wherein the n-type ohmic contact buffer layer has a $1 \times 10^{20}$ cm$^{-3}$ or higher doping concentration and is formed by injecting ion via the ion implantation method.

10. A GaN-based LED epitaxial structure, including:
   a GaN-based n-type ohmic contact buffer layer of 3.4 eV or lower bandgap and $1 \times 10^{18}$ cm$^{-3}$ or higher electron concentration, wherein the n-type ohmic contact buffer layer has a non-Nitride-polarity surface for forming an n-type ohmic contact electrode thereon; wherein the non-Nitride-polarity surface is formed by removing a growth substrate to expose the surface; and
   a light-emitting epitaxial layer over the n-type ohmic contact buffer layer, including at least an n-type semiconductor layer, an active layer, and a p-type semiconductor layer.

11. The GaN-based LED epitaxial structure according to claim 10, wherein the n-type ohmic contact buffer layer comprises $Al_cIn_dGa_{1-c-d}N$ (0≤c<1, 0≤d<1, c+d<1).

12. The GaN-based LED epitaxial structure according to claim 10, wherein the n-type ohmic contact buffer layer is grown at a temperature of 500-600° C. to thereby form the non-Nitride-polarity surface.

13. The GaN-based LED epitaxial structure according to claim 10, wherein a thickness of the n-type ohmic contact buffer layer is 10 Å-5,000 Å.

14. The GaN-based LED epitaxial structure according to claim 10, wherein the n-type ohmic contact buffer layer is Si-doped nitride of $1 \times 10^{18}$ cm$^{-3}$ or higher doping concentration, or the n-type ohmic contact buffer layer is Si-doped nitride of $1 \times 10^{20}$ cm$^{-3}$ or higher doping concentration.

15. The GaN-based LED epitaxial structure according to claim 14, further comprising a Si-doped n-type nitride gradient semiconductor layer between the n-type ohmic contact buffer layer and the light-emitting epitaxial layer.

16. A GaN-based LED chip, including:
   a conductive base with a front and a reverse surface;
   a light-emitting epitaxial layer over the front surface of the conductive base, including an n-type semiconductor layer, an active layer, and a p-type semiconductor layer;
   a GaN-based n-type ohmic contact buffer layer of 3.4 eV or lower bandgap and $1 \times 10^{18}$ cm$^{-3}$ or higher electron concentration over the n-type semiconductor layer;
   a first electrode over the reverse surface of the conductive base; and
   a second electrode over the n-type ohmic contact buffer layer;
   wherein the n-type ohmic contact buffer layer has a non-Nitride-polarity surface over which the second electrode is formed.

17. The LED chip according to claim 16, wherein the n-type ohmic contact buffer layer comprises $Al_cIn_dGa_{1-c-d}N$ (0≤c<1, 0≤d<1, c+d<1).

18. The LED chip according to claim 16, wherein the n-type ohmic contact buffer layer is grown at a temperature of 500-600° C. to thereby form the non-Nitride-polarity surface.

19. The LED chip according to claim 16, wherein a thickness of the n-type ohmic contact buffer layer is 10 Å-5,000 Å.

20. The LED chip according to claim 16, wherein the n-type ohmic contact buffer layer is Si-doped nitride of $1 \times 10^{18}$ cm$^{-3}$ or higher doping concentration, or the n-type ohmic contact buffer layer is Si-doped nitride of $1 \times 10^{20}$ cm$^{-3}$ or higher doping concentration.

* * * * *